United States Patent
Lee et al.

(10) Patent No.: US 8,293,149 B2
(45) Date of Patent: Oct. 23, 2012

(54) PHOTOSENSITIVE RESIN COMPOSITION FOR COLOR FILTER AND COLOR FILTER USING THE SAME

(75) Inventors: Chang-Min Lee, Uiwang-si (KR); Jun-Seok Kim, Uiwang-si (KR); Kil-Sung Lee, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/190,979

(22) Filed: Jul. 26, 2011

(65) Prior Publication Data

US 2012/0145972 A1  Jun. 14, 2012

(30) Foreign Application Priority Data

Dec. 10, 2010 (KR) .................. 10-2010-0126487

(51) Int. Cl.
| | |
|---|---|
| G02B 5/23 | (2006.01) |
| C08F 2/50 | (2006.01) |
| C08F 2/46 | (2006.01) |
| C08J 3/28 | (2006.01) |
| G03F 7/033 | (2006.01) |
| G03F 7/032 | (2006.01) |

(52) U.S. Cl. .............. 252/586; 204/192.15; 427/255.28; 428/451; 428/480; 430/270.1; 430/281.1; 430/286.1; 430/287.1; 430/293; 522/33; 522/42; 522/46; 522/53; 522/63; 522/71; 522/74; 522/78; 522/79; 522/80; 522/81; 522/101; 522/103; 522/104; 522/113; 522/120; 522/123; 522/149; 522/153; 522/178; 522/182; 522/183; 526/319; 526/320

(58) Field of Classification Search ............ 204/192.15; 252/586; 430/7, 270.1, 281.1, 286.1, 287.1, 430/293; 522/33, 42, 46, 53, 63, 78, 79, 522/182, 71, 74, 80, 81, 101, 103, 104, 113, 522/120, 123, 149, 153, 154, 178, 183; 526/319, 526/320; 427/255.28; 428/451, 480

See application file for complete search history.

(56) References Cited

U.S. PATENT DOCUMENTS

| | | | |
|---|---|---|---|
| 5,663,019 A | 9/1997 | Matsumura et al. | |
| 5,827,626 A * | 10/1998 | Kobayashi et al. | ............... 430/7 |
| 5,998,091 A | 12/1999 | Suzuki | |
| 7,763,402 B2 | 7/2010 | Cho et al. | |
| 2002/0172873 A1 | 11/2002 | Ueda et al. | |
| 2010/0160474 A1 | 6/2010 | Lee et al. | |

FOREIGN PATENT DOCUMENTS

| | | |
|---|---|---|
| EP | 0628599 A1 | 12/1994 |
| EP | 0725315 A2 | 8/1996 |
| JP | 07-140654 | 6/1995 |
| JP | 10-254133 | 9/1998 |
| KR | 10-1992-7002502 A1 | 12/1991 |
| KR | 10-1993-7000858 A1 | 8/1992 |
| KR | 10-1994-0005617 B1 | 6/1994 |
| KR | 10-1995-7000359 A1 | 7/1994 |
| KR | 10-1995-7003746 A1 | 1/1995 |
| KR | 10-1995-0011163 B1 | 9/1995 |
| KR | 10-1996-0029904 | 8/1996 |
| KR | 10-2009-0024561 A | 3/2009 |
| KR | 10-2009-0066242 A | 6/2009 |

* cited by examiner

*Primary Examiner* — Bijan Ahvazi
(74) *Attorney, Agent, or Firm* — Summa, Additon & Ashe, P.A.

(57) ABSTRACT

Disclosed are a photosensitive resin composition for a color filter and a color filter using the same. The photosensitive resin composition for a color filter may include (A) a copolymer including a structural unit represented by the following Chemical Formula 1, wherein the substituents of Chemical Formula 1 are the same as defined in the specification; (B) an acrylic-based photopolymerizable monomer; (C) a photopolymerization initiator; (D) a pigment; and (E) a solvent.

[Chemical Formula 1]

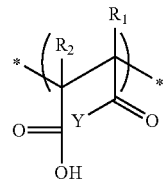

8 Claims, No Drawings

PHOTOSENSITIVE RESIN COMPOSITION FOR COLOR FILTER AND COLOR FILTER USING THE SAME

CROSS-REFERENCE TO RELATED APPLICATION

This application claims priority under 35 USC Section 119 to and the benefit of Korean Patent Application No. 10-2010-0126487 filed in the Korean Intellectual Property Office on Dec. 10, 2010, the entire disclosure of which is incorporated herein by reference.

FIELD OF THE INVENTION

The present invention relates to a photosensitive resin composition for a color filter and a color filter using the same.

BACKGROUND OF THE INVENTION

Color filters are used in a variety of products, such as liquid crystal displays (LCDs), optical filters for cameras, and the like. Color filters can be fabricated by coating a fine region colored with three or more colors to form a colored thin film on a charge coupled device or a transparent substrate. The colored thin film is commonly fabricated by methods such as dyeing, printing, electrophoretic deposition (EPD), and pigment dispersion.

The dyeing method forms a colored film by forming an image with a dyeing agent such as a natural photosensitive resin such as gelatin, an amine-modified polyvinyl alcohol, an amine-modified acryl-based resin, and the like, on a substrate and then dyeing the image with direct dyes. However, the dyeing process can be complex and time consuming, since it should include resist printing whenever a color needs to be changed to form a multicolored thin film on the same substrate. In addition, conventionally used dyes and resins generally have good color vividness and dispersion but poor light fastness, water resistance, and heat resistance, which are very important characteristics. For example, azo and azide compounds can be used as a dye, but they can exhibit deteriorated heat resistance and durability as compared with a pigment.

The printing method forms a colored thin film by printing an ink prepared by dispersing a pigment into a thermally curable or photocurable resin and curing it with heat or light. This method may decrease material costs as compared with other methods, but it can be difficult to form a fine and precise image and obtain a uniform thin film layer.

Korean Patent Laid-Open Publication No. 1995-7003746 discloses a method of making a color filter in an inkjet method. However, this method disperses a dye-type photosensitive resin composition from a nozzle to provide fine and precise color printing and thus it can also has the same problems of deteriorated durability and heat resistance as the dyeing method.

Korean Patent Laid-Open Publication Nos. 1993-7000858 and 1996-0029904 disclose electrophoretic deposition (EPD) using an electric precipitation method. The electrophoretic deposition (EPD) can form a precise color film having excellent heat resistance and light fastness, since it includes a pigment. However, when a finer electrode pattern is needed for a more sophisticated pixel in the future, it may be difficult to use the method to produce a color filter for highly sophisticated applications since the resultant colored thin film may be stained or thicker at both ends due to electrical resistance.

The pigment dispersion method forms a colored film by repeating a series of processes such as coating, exposing to light, developing, and curing a photopolymer composition including a coloring agent on a transparent substrate including a black matrix. This pigment dispersion method can improve heat resistance and durability, which are very important characteristics of a color filter, and can uniformly maintain the thickness of the film. As examples, Korean Patent Laid-Open Publication Nos. 1992-7002502 and 1995-7000359, Korean patent publication No. 1994-0005617, and Korean Patent Laid-Open Publication No. 1995-0011163 disclose a method of making a photosensitive resin composition for a color filter using a pigment dispersion method.

When a photosensitive resin composition for a color filter is prepared according to a pigment dispersion method, it generally includes a binder resin, a photopolymerizable monomer, a photopolymerization initiator, an epoxy resin, a solvent, and other additives. For example, in Japanese Patent Laid-Open Publication Nos. Pyung 7-140654 and 10-254133, the binder resin includes a carboxyl-containing acryl-based copolymer (A).

The color filter can be subjected to many chemical treatments during the manufacturing process. Accordingly, a color photosensitive resin should have a development margin and chemical resistance sufficient to improve yields of the color filter and to maintain a pattern formed under the aforementioned conditions.

Conventional color liquid crystal displays (LCD) are generally manufactured by preparing a color filter substrate for displaying a color image separately from an operating substrate on which a thin film transistor (TFT) array is disposed, and then binding the color filter substrate and the operating substrate together. However, since there can be low arrangement accuracy during the binding step, conventional color liquid crystal displays are required to have a shading layer with a large width. Accordingly, it is difficult to increase the aperture ratio (the ratio of active light-emitting area to total pixel area). In addition, as glass substrates and LCD screens for LCDs become larger, it can takes longer for the liquid crystal composition to cover a front side of the substrates during vacuum injection. A method has been suggested to sharply decrease the time needed for printing a seal material and dripping a liquid crystal for an over-coating, but this method has a problem of sharply deteriorating arrangement accuracy.

A method for forming a color filter on the operating TFT array substrate of a TFT color liquid crystal display (LCD) has also been suggested. Since a color filter substrate is unnecessary, this method has an advantage of simple arrangement and an increased aperture ratio by binding two substrates after fabricating a transparent substrate through sputtering.

However, when a color filter is formed on a TFT array substrate, a pixel electrode is formed on the color filter in a photolithography method by using a general positive photosensitive resin composition. Accordingly, the photosensitive resin film needs to be removed after forming the electrode. In other words, a pixel electrode is formed by forming a transparent electrode layer on color pixels of a color filter, coating a positive resist thereon, patterning it, exposing it to light, and developing it. Then, the photosensitive resin film remaining on the pixel electrode is peeled and removed with a resist stripper. Accordingly, the photosensitive resin composition requires resistance against a resist stripper. Conventional photosensitive resin compositions, however, typically have weak stripper-resistance.

Conventionally, a pixel electrode is fabricated by forming a pixel protective layer having stripper-resistance on a color filter. In addition, a pixel electrode can be fabricated by using a stripper and peeling a positive resist at a low temperature for a longer time without coating a pixel protective layer. However, these methods have problems of deteriorating yield rate and production efficiency, since they require more processes and a longer time.

In order to solve these problems, a radiation-sensitive composition with an expansion rate of less than 5% against the stripper solution to remove a cured layer forming a color layer in a COA method can be used. Further, a color filter can have improved thermal polymerization cross-linking effects by using a multi-functional alicyclic epoxy compound in a thermal polymerization cross-linking agent and a benzophenone-based peroxide as a photo-thermal polymerization initiator. According to this method, a color filter can be cured at a low temperature and for a short time, and can thereby have excellent durability and close contacting (adhesion) properties. However, there is an increased demand for larger screens with higher image quality than can be produced using conventional methods, and thus there is a need for color filters with a higher aperture ratio and higher performance.

SUMMARY OF THE INVENTION

One embodiment of the present invention provides a photosensitive resin composition for a color filter that can have excellent heat resistance and chemical resistance.

Another embodiment of the present invention provides a color filter manufactured using the photosensitive resin composition for a color filter.

According to one embodiment of the present invention, a photosensitive resin composition for a color filter includes (A) a copolymer including a structural unit represented by the following Chemical Formula 1; (B) an acrylic-based photopolymerizable monomer; (C) a photopolymerization initiator; (D) a pigment; and (E) a solvent:

[Chemical Formula 1]

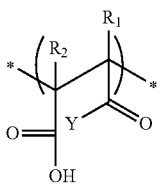

In Chemical Formula 1, $R_1$ and $R_2$ are the same or different and are each independently H or substituted or unsubstituted C1 to C20 alkyl, and Y is a structure represented by the following Chemical Formulae 2 to 4:

[Chemical Formula 2]

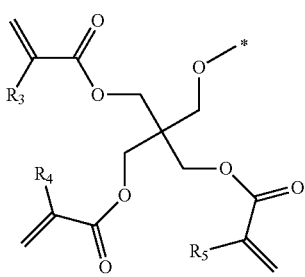

[Chemical Formula 3]

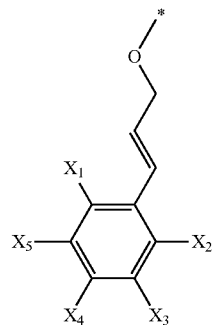

[Chemical Formula 4]

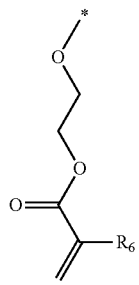

In Chemical Formulae 2 to 4, $R_3$ to $R_6$ are the same or different and are each independently H or substituted or unsubstituted C1 to C20 alkyl, and $X_1$ to $X_5$ are the same or different and are each independently H, halogen, hydroxyl, substituted or unsubstituted amino, substituted or unsubstituted C1 to C20 alkyl, allyl, or C6 to C30 aryl.

The photosensitive resin composition for a color filter may include about 1 to about 60 wt % of the copolymer (A) including a structural unit represented by Chemical Formula 1; about 0.5 to about 20 wt % of the acrylic-based photopolymerizable monomer (B); about 0.1 to about 10 wt % of the photopolymerization initiator (C); about 0.1 to about 40 wt % of the pigment (D); and a balance amount of the solvent (E).

The copolymer (A) may include the structural unit represented by Chemical Formula 1 in an amount of about 0.05 to about 50 wt %, for example about 0.1 to about 30 wt %, based on the total weight of the copolymer (A).

The copolymer (A) including a structural unit represented by Chemical Formula 1 may have a weight average molecular weight (Mw) of about 3,000 to about 500,000 g/mol.

The copolymer including a structural unit represented by Chemical Formula 1 may have an acid value of about 20 to about 200 mgKOH/g.

The copolymer (A) including a structural unit represented by Chemical Formula 1 may further include at least one structural unit represented by the following Chemical Formulae 5 to 9, or a combination thereof:

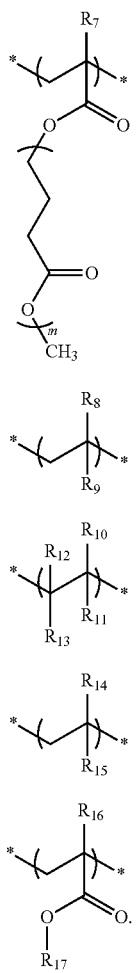

[Chemical Formula 5]

[Chemical Formula 6]

[Chemical Formula 7]

[Chemical Formula 8]

[Chemical Formula 9]

In Chemical Formulae 5 to 9, $R_7$, $R_8$, $R_{10}$, $R_{12}$, $R_{14}$ and $R_{16}$ are the same or different and are independently hydrogen or C1 to C10 alkyl, $R_9$ is hydrogen, halogen, hydroxyl, carboxyl, substituted or unsubstituted C1 to C20 alkyl, or COR'COOH (wherein R' is substituted or unsubstituted C1 to C20 alkylene or substituted or unsubstituted C1 to C20 alkoxylene), $R_{11}$ is carboxyl or CONHR" (wherein R" is substituted or unsubstituted C1 to C20 alkyl or substituted or unsubstituted C6 to C30 aryl), $R_{13}$ is carboxyl, or $R_{11}$ and $R_{13}$ are optionally fused with each other to form a ring, $R_{15}$ is substituted or unsubstituted C6 to C30 aryl, $R_{17}$ is substituted or unsubstituted C1 to C20 alkyl or substituted or unsubstituted C6 to C30 aryl, and m is an integer ranging from 1 to 5.

When mole ratios of the structural units represented by Chemical Formulae 5 to 9 are $n^1$, $n^2$, $n^3$, $n^4$ and $n^5$, respectively, $5 \leq n^1 \leq 50$, $1 \leq n^2 \leq 20$, $5 \leq n^3 \leq 20$, $10 \leq n^4 \leq 100$, and $10 \leq n^5 \leq 100$.

The photosensitive resin composition may further include one or more additives such as but not limited to a dispersing agent; malonic acid; 3-amino-1,2-propanediol; a silane-based coupling agent including a vinyl group or a (meth)acryloxy group; a leveling agent; a fluorine-based surfactant; a radical polymerization initiator, and the like, and mixtures thereof.

Another embodiment of the present invention provides a color filter manufactured using the photosensitive resin composition for a color filter.

Hereinafter, embodiments of the present invention will be described in detail.

Since the photosensitive resin composition can have excellent heat resistance and chemical resistance, it may be used to form a color filter on a TFT array substrate to provide a high aperture ratio.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "alkyl" may refer to C1 to C20 alkyl, the term "aryl" may refer to C6 to C30 aryl, the term "arylalkyl" may refer to C7 to C30 arylalkyl, the term "alkylene" may refer to C1 to C20 alkylene, and the term "alkoxylene" may refer to C1 to C20 alkoxylene.

As used herein, when a specific definition is not otherwise provided, the term "substituted" may refer to one substituted with halogen (F, Cl, Br, or I), hydroxy, cyano, imino (=NH, =NR, wherein R is C1 to C10 alkyl), amino (—$NH_2$, —NH($R_a$), —N($R_b$)($R_c$), wherein $R_a$ to $R_c$ are the same or different and are each independently C1 to C10 alkyl), amidino, hydrazine, hydrazone, carboxyl, substituted or unsubstituted C1 to C20 alkyl, substituted or unsubstituted C6 to C30 aryl, substituted or unsubstituted C3 to C30 cycloalkyl, substituted or unsubstituted C3 to C30 heteroaryl, substituted or unsubstituted C2 to C30 heterocycloalkyl, or a combination thereof, in place of at least one of hydrogen.

As used herein, when a specific definition is not otherwise provided, the prefix "hetero" may refer to one substituted with at least one heteroatom including N, O, S, P, or a combination thereof.

The photosensitive resin composition for a color filter according to one embodiment of the present invention includes (A) a copolymer including a structural unit represented by the following Chemical Formula 1; (B) an acrylic-based photopolymerizable monomer; (C) a photopolymerization initiator; (D) a pigment; and (E) a solvent:

[Chemical Formula 1]

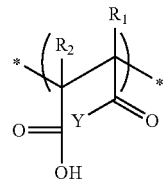

In Chemical Formula 1, $R_1$ and $R_2$ are each independently H or substituted or unsubstituted C1 to C20 alkyl, and Y is a structure represented by the following Chemical Formulae 2 to 4,

[Chemical Formula 2]

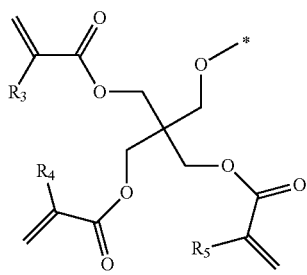

[Chemical Formula 3]

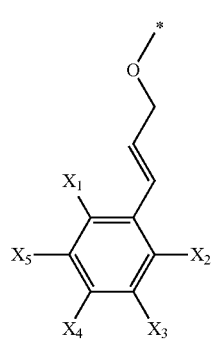

[Chemical Formula 4]

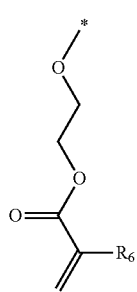

In Chemical Formulae 2 to 4, $R_3$ to $R_6$ are the same or different and are each independently H or substituted or unsubstituted C1 to C20 alkyl, and $X_1$ to $X_5$ are the same or different and are each independently H, halogen, hydroxyl, substituted or unsubstituted amino, substituted or unsubstituted C1 to C20 alkyl, allyl, or C6 to C30 aryl.

The photosensitive resin composition for a color filter according to one embodiment may further include one or more other additives (F).

Since the photosensitive resin composition can have excellent heat resistance and chemical resistance, it can be used in the production of a color filter formed on a TFT array substrate to provide a high aperture ratio.

Hereinafter, each component of the photosensitive resin composition for a color filter according to one embodiment of the present invention is illustrated in detail.

(A) Copolymer Including a Structural Unit Represented by Chemical Formula 1

The copolymer is obtained by copolymerizing a first ethylenic unsaturated monomer including at least one carboxyl group and a second ethylenic unsaturated monomer copolymerizable with the first ethylenic unsaturated monomer, and reacting the resultant copolymer with a compound having a double bond, a carboxyl group, or an ester group.

Examples of the first ethylenic unsaturated monomer may include without limitation (meth)acrylic acid, maleic acid, itaconic acid, fumaric acid, maleic anhydride, and the like, and combinations thereof.

The copolymer may include the first ethylenic unsaturated monomer in an amount of about 1 to about 50 wt %, for example about 3 to about 40 wt %, and as another example about 5 to about 30 wt %, based on the total weight of the first ethylenic unsaturated monomer and the second ethylenic unsaturated monomer. In some embodiments, the copolymer may include the first ethylenic unsaturated monomer in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

When the first ethylenic unsaturated monomer is included in an amount within these ranges, desired developability, heat resistance, and chemical resistance may be obtained.

Examples of the second ethylenic unsaturated monomer may include without limitation aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl(meth)acrylate, and the like; carboxylic acid vinyl ester compounds such as vinyl acetate, vinyl benzoate, and the like; unsaturated carboxylic acid glycidyl ester compounds such as glycidyl(meth)acrylate, and the like; vinyl cyanide compounds such as (meth)acrylonitrile, and the like; and unsaturated amide compounds such as (meth)acrylamide, and the like. These compounds may be used singularly or as a mixture of two or more.

Examples of the compound including the double bond, carboxyl group or ester group may include without limitation cinnamyl alcohol, pentaerythritol triacrylate, 2-hydroxyethyl acrylate, and the like, and combinations thereof. The copolymer may include the compound including the double bond, carboxyl group, or ester group in an amount of about 0.05 to about 50 parts by weight, based on about 100 parts by weight of a copolymer produced from copolymerization of the first monomer and the second monomer. In some embodiments, the copolymer may include the compound including the double bond, carboxyl group or ester group in an amount of about 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 parts by weight. Further, according to some embodiments of the present invention, the amount of the compound including the double bond, carboxyl group or ester group can be in a range from about any of the foregoing amounts to about any other of the foregoing amounts.

Within the copolymer includes the compound including the double bond, carboxyl group or ester group in an amount in the above range, developability that is desirable for a process can be provided, and patterning and heat resistance, chemical resistance and the like can be improved.

The copolymer (A) includes a structural unit represented by the following Chemical Formula 1:

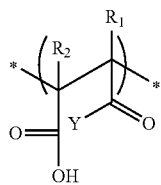
[Chemical Formula 1]

In Chemical Formula 1, $R_1$ and $R_2$ are the same or different and each independently H or substituted or unsubstituted C1 to C20 alkyl, and Y is a structure represented by the following Chemical Formulae 2 to 4,

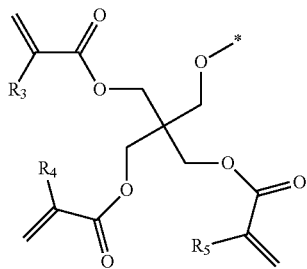
[Chemical Formula 2]

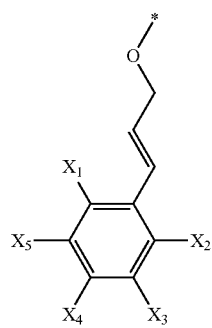
[Chemical Formula 3]

[Chemical Formula 4]

In Chemical Formulae 2 to 4, $R_3$ to $R_6$ are the same or different and are each independently H or substituted or unsubstituted C1 to C20 alkyl, and $X_1$ to $X_5$ are the same or different and are each independently H, halogen, hydroxyl, substituted or unsubstituted amino, substituted or unsubstituted C1 to C20 alkyl, allyl, or C6 to C30 aryl.

The copolymer (A) can have improved developability due to the structural unit represented by Chemical Formula 1 including the double bond, carboxyl group or ester group, and also can have improved sensitivity due to the structural unit including the double bond.

The copolymer (A) may include the structural unit represented by Chemical Formula 1 in an amount of about 0.05 to about 50 wt %, for example about 0.1 to about 30 wt %, based on the total weight of the copolymer (A). In some embodiments, the copolymer may include the structural unit represented by Chemical Formula 1 in an amount of about 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the structural unit represented by Chemical Formula 1 can be in a range from about any of the foregoing amounts to about any other of the foregoing amounts. When the structural unit represented by Chemical Formula 1 is included in an amount within the above range, it can provide properties such as developability, heat resistance, and chemical resistance appropriate for processing.

The copolymer (A) may further include a structural unit represented by the following Chemical Formulae 5 to 9, or a combination thereof to, which can provide a fine pattern and excellent heat resistance and chemical resistance, which are significant factors for a color filter fabricated through a COA process.

[Chemical Formula 5]

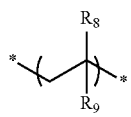

[Chemical Formula 6]

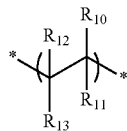

[Chemical Formula 7]

[Chemical Formula 8]

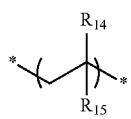

-continued

[Chemical Formula 9]

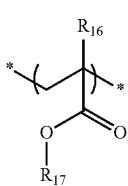

In Chemical Formulae 5 to 9, $R_7$, $R_9$, $R_{10}$, $R_{12}$, $R_{14}$ and $R_{16}$ are the same or different and are independently hydrogen or C1 to 010 alkyl, $R_9$ is hydrogen, halogen, hydroxyl, carboxyl, substituted or unsubstituted C1 to C20 alkyl, or COR'COOH (wherein R' is substituted or unsubstituted C1 to C20 alkylene or substituted or unsubstituted C1 to C20 alkoxylene), $R_{11}$ is carboxyl or CONHR" (wherein R" is substituted or unsubstituted C1 to C20 alkyl or substituted or unsubstituted C6 to C30 aryl), $R_{13}$ is carboxyl, or $R_{11}$ and $R_{13}$ are optionally fused with each other to form a ring, $R_{15}$ is substituted or unsubstituted C6 to C30 aryl, $R_{17}$ is substituted or unsubstituted C1 to C20 alkyl or substituted or unsubstituted C6 to C30 aryl, and m is an integer ranging from 1 to 5.

When the copolymer (A) includes all of the structural units of Chemical Formulae 5 to 9, the moles of each structural unit can be represented by $n^1$, $n^2$, $n^3$, $n^4$ and $n^5$, respectively, and can be in the following ranges: $55 \leq n^1 \leq 50$, $1 \leq n^2 \leq 20$, $5 \leq n^3 \leq 20$, $10 \leq n^4 \leq 100$, and $10 \leq n^5 \leq 100$. When the structural units represented by Chemical Formulae 5 to 9 are included in an amount within the above ranges, appropriate developability and heat resistance and chemical resistance may be provided.

The monomers providing structural units represented by Chemical Formulae 5 to 9 have a similar structure to an optical reactive functional group included in a photopolymerizable monomer, which will be described later. A radical induced by a photopolymerization initiator, which will be described later, is added to the monomers providing a structural unit represented by Chemical Formulae 5 to 9, and a cross-linking bond in the copolymer (A) may be produced by a photopolymerization reaction.

The extent of optical cross-linking (an extent of cross-linking) formed by the monomer providing the structural units represented by Chemical Formulae 5 to 9 may be determined based on the composition ratio of an acrylic-based photopolymerizable monomer, which will be described below, to the photopolymerization initiator, and thus, the extent of the cross-linking may be adjusted based on the composition ratio of the acrylic-based photopolymerizable monomer to the photopolymerization initiator.

The copolymer (A) may have a weight average molecular weight of about 3,000 to about 500,000 g/mol, for example about 5,000 to about 50,000 g/mol. When the weight average molecular weight of the copolymer is within the above range, developability of the photosensitive a resin composition may be improved.

The copolymer (A) may have an acid value of about 20 to about 200 mgKOH/g, for example about 50 to about 200 mgKOH/g. When the acid value of the copolymer is within the above range, developability of the photosensitive a resin composition may be improved.

The photosensitive resin composition for a color filter may include the copolymer (A) in an amount of about 1 to about 60 wt %, for example about 5 to about 50 wt %, based on the total weight of the photosensitive resin composition. In some embodiments, the photosensitive resin composition may include the copolymer (A) in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 wt %. Further, according to some embodiments of the present invention, the amount of the copolymer (A) can be in a range from about any of the foregoing amounts to about any other of the foregoing amounts.

When the copolymer (A) is included in an amount within the above range, the composition may have excellent developability for an alkali development solution, surface roughness may decrease due to good cross-linking, and the pattern may not be peeled off due to good chemical resistance.

(B) Acrylic-Based Photopolymerizable Monomer

Examples of the acrylic-based photopolymerizable monomer (B) include without limitation ethylene glycol diacrylate, triethylene glycol diacrylate, 1,4-butanediol diacrylate, 1,6-hexanediol diacrylate, neopentyl glycol diacrylate, pentaerythritol diacrylate, pentaerythritol triacrylate, dipentaerythritol diacrylate, dipentaerythritol triacrylate, dipentaerythritol pentaacrylate, pentaerythritol hexaacrylate, bisphenolA diacrylate, trimethylolpropane triacrylate, novolacepoxy acrylate, ethyleneglycol dimethacrylate, diethyleneglycol dimethacrylate, triethyleneglycol dimethacrylate, propyleneglycol dimethacrylate, 1,4-butanediol dimethacrylate, 1,6-hexanediol dimethacrylate, and the like, and combinations thereof.

The photosensitive resin composition for a color filter may include the acrylic-based photopolymerizable monomer in an amount of about 0.5 to about 20 wt %, based on the total weight of the photosensitive resin composition for a color filter. In some embodiments, the photosensitive resin composition for a color filter may include the acrylic-based photopolymerizable monomer in an amount of about 0.5, 0.6, 0.7, 0.8, 0.9, 1, 2, 3, 4, 5, 6, 7, 8, 9, 10, 11, 12, 13, 14, 15, 16, 17, 18, 19, or 20 wt %. Further, according to some embodiments of the present invention, the amount of the acrylic-based photopolymerizable monomer can be in a range from about any of the foregoing amounts to about any other of the foregoing amounts.

When the photosensitive resin composition for a color filter includes the acrylic-based photopolymerizable monomer in an amount within the above range, the composition may form a pattern having a clear edge and excellent development with an alkali development solution.

(C) Photopolymerization Initiator

Examples of the photopolymerization initiator (C) may include without limitation triazine-based compounds, acetophenone-based compounds, benzophenone-based compounds, thioxanthone-based compounds, benzoin-based compounds, oxime-based compounds, and the like, and combinations thereof.

Examples of the triazine-based compound may include without limitation 2,4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis(trichloro methyl)-s-triazine, 2-biphenyl-4,6-bis(trichloro methyl)-s-triazine, bis(trichloro methyl)-6-styryl-s-triazine, 2-(naphtho-1-yl)-4,6-bis(trichloro methyl)-s-triazine, 2-(4-methoxy naphtho-1-yl)-4,6-bis(trichloro methyl)-s-triazine, 2,4-trichloro methyl(piperonyl)-6-triazine, 2,4-(trichloro methyl (4'-methoxy styryl)-6-triazine, and the like, and combinations thereof.

Examples of the acetophenone-based compound may include without limitation 2,2'-diethoxy acetophenone, 2,2'-dibutoxy acetophenone, 2-hydroxy-2-methyl propinophenone, p-t-butyl trichloro acetophenone, p-t-butyl dichloro acetophenone, 4-chloro acetophenone, 2,2'-dichloro-4-phenoxy acetophenone, 2-methyl-1-(4-(methylthio)phenyl)-2-morpholino propan-1-one, 2-benzyl-2-dimethyl amino-1-(4-morpholino phenyl)-butan-1-one, and the like, and combinations thereof.

Examples of the benzophenone-based compound may include without limitation benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-dichloro benzophenone, 3,3'-dimethyl-2-methoxy benzophenone, and the like, and combinations thereof.

Examples of the thioxanthone-based compound may include without limitation thioxanthone, 2-methyl thioxanthone, isopropyl thioxanthone, 2,4-diethyl thioxanthone, 2,4-diisopropyl thioxanthone, 2-chloro thioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyl dimethyl ketal, and the like, and combinations thereof.

Examples of the oxime-based compound may include without limitation 2-(o-benzoyloxime)-1-[4-(phenylthio)phenyl]-1,2-octanedione and 1-(o-acetyloxime)-1-[9-ethyl-6-(2-methylbenzoyl)-9H-carbazol-3-yl]ethanone, and the like, and combinations thereof.

The photopolymerization initiator may include a carbazole-based compound, a diketone-based compound, a sulfonium borate-based compound, diazo-based, a biimidazole-based compound, and the like, and combinations thereof, other than or in addition to the above photopolymerization initiators (C).

The photosensitive resin composition for a color filter may include the photopolymerization initiator (C) in an amount of about 0.1 to about 10 wt %, based on the total weight of the photosensitive resin composition. In some embodiments, the photosensitive resin composition for a color filter may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from about any of the foregoing amounts to about any other of the foregoing amounts.

When the photosensitive resin composition for a color filter includes the photopolymerization initiator in an amount within these ranges, it may cause sufficient photopolymerization during the pattern forming process when exposed to light. In addition, unreacted initiator left after the photopolymerization may not deteriorate transmittance.

(D) Pigment

For the pigment (D), a pigment having a color such as red, green, blue, yellow, or violet color may be used. Examples of the pigment may include without limitation anthraquinone-based pigments, condensation polycyclic pigments such as perylene-based pigments and the like, phthalocyanine pigments, azo-based pigments, and the like. The pigment may be used singularly or as a combination of two or more. The combination of two or more pigments can be useful for adjusting maximum absorption wavelength, cross point, crosstalk, and the like.

The pigment (D) may be prepared as a pigment dispersion and included in the photosensitive resin composition for a color filter.

In addition, a dispersing agent may be used, so that the pigment (D) component can be uniformly dispersed. Examples of the dispersing agent may include without limitation nonionic, anionic, and cationic dispersing agents, for example polyalkylene glycol and esters thereof, polyoxyalkylene, polyhydric alcohol ester alkylene oxide additives, alcohol alkylene oxide addition product, sulfonic acid esters, sulfonic acid salts, carboxylic acid esters, carboxylic acid salts, an alkyl amide alkylene oxide additive, an alkyl amine, and the like. These dispersing agents may be used singularly or as a combination of two or more.

In addition, a carboxyl-containing acrylic-based resin as well as the dispersing agent may be added to the pigment in order to improve stability of the pigment dispersion and pattern of pixels.

The pigment (D) can have a primary particle diameter ranging from about 10 to about 80 nm. In another embodiment, the pigment (D) can have a primary particle diameter ranging from about 10 to about 70 nm. When the pigment (D) has a primary particle diameter within the above range, it can have excellent stability in pigment dispersion and may not deteriorate resolution of pixels.

The photosensitive resin composition may include the pigment (D) in an amount of about 0.1 to about 40 wt %, based on the total amount of the photosensitive resin composition. In some embodiments, the photosensitive resin composition for a color filter may include the pigment in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the pigment can be in a range from about any of the foregoing amounts to about any other of the foregoing amounts.

When the pigment is used in an amount within the above range, coloring effect and developability may be improved.

(E) Solvent

Examples of the solvent (E) may include without limitation ethylene glycol acetate, ethyl cellosolve, ethyl ethoxy propionate, ethyl lactate, polyethylene glycol, and the like, and combinations thereof. The solvent may also include ethylene glycol compounds such as ethylene glycol, diethylene glycol, and the like; glycol ether compounds such as ethylene glycol monomethyl ether, diethylene glycol monomethyl ether, ethylene glycol diethyl ether, diethylene glycol dimethylether, and the like; glycol ether acetate compounds such as ethylene glycol monoethylether acetate, diethylene glycol monoethyl ether acetate, diethylene glycol monobutylether acetate, and the like; propylene glycols such as propylene glycol, and the like; propylene glycol ether compounds such as propylene glycol monomethyl ether, propylene glycol monoethylether, propylene glycol monopropyl ether, propylene glycol monobutyl ether, propylene glycol dimethylether, dipropylene glycol dimethyl ether, propylene glycol diethyl ether, dipropylene glycol diethyl ether, and the like; propylene glycol ether acetate compounds such as propylene glycol monomethyl ether acetate, dipropylene glycol monoethylether acetate, and the like; amide compounds such as N-methylpyrrolidone, dimethyl formamide, dimethyl acetamide, and the like; ketone compounds such as methyl ethyl ketone (MEK), methyl isobutyl ketone (MIBK), cyclohexanone, and the like; petroleum compounds such as toluene, xylene, solvent naphtha, and the like; ester compounds such as ethyl acetate, butyl acetate, ethyl lactate, and the like. These solvents may be used singularly or as a combination of two or more.

The solvent (E) may be included in a balance amount. In exemplary embodiments, the photosensitive resin composition for a color filter can include the solvent in an amount of about 20 to about 90 wt %, based on the total weight of the photosensitive resin composition. In some embodiments, the photosensitive resin composition for a color filter may include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is included in an amount within the above range, the photosensitive resin composition may have excellent coating properties. In addition, it can maintain flatness when the composition is coated as a 1 μm thick or thicker film.

(F) Other additives

The photosensitive resin composition for a color filter may further include a dispersing agent in order to uniformly disperse the pigment (D) in the solvent (E), besides the (A) to (E) components, as above mentioned.

The photosensitive resin composition may also include one or more other additives such as but not limited to malonic acid; 3-amino-1,2-propanediol; a silane-based coupling agent including a vinyl group or a (meth)acryloxy group; a leveling agent; a fluorine-based surfactant; a radical polymerization initiator, and the like, and combinations thereof in order to prevent a stain or a spot during the coating and generation of a residue due to non-development and to control leveling. The amount of these additives may be readily determined by the skilled artisan without undue experimentation, and the amounts may vary depending on the desired composition properties.

The photosensitive resin composition for a color filter according to one embodiment can be coated to a thickness of about 3.1 to about 3.4 μm on a bare glass substrate or a glass substrate with an about 500 Å to about 1500 Å thick $SiN_x$ (protective layer) thereon by a method such as but not limited to spin coating, slit coating, and the like. After coating, the layer can be exposed to radiation (be irrradiated by light) to form a pattern required for a color filter. When the coating layer is treated with an alkali development solution to dissolve the non-radiated part, a pattern for a color filter is formed. This process can be repeated as many times as necessary, depending on the number of colors of R, G, B, needed to provide a color filter with a desired pattern. In addition, the developed image pattern can be heated or cured by exposing to actinic rays to improve crack resistance, solvent resistance, and the like.

In general, since a negative photosensitive resin is not easily stripped by an organic solvent, its residue may contaminate a lower layer. In addition, since the negative photosensitive resin is more weakly adhered to a lower layer than a positive photosensitive resin, it may have a larger under-cut. According to an exemplary embodiment of the present invention, a photosensitive resin composition for a color filter may improve stripper resistance of such a negative photosensitive resin, may inhibit contamination of a lower layer, and may improve close contacting property with a lower layer.

The following examples illustrate the present invention in more detail. However, it is understood that the present invention is not limited by these examples.

Synthesis Examples 1 to 6

8 wt % of 2,2'-azobis(2,4-dimethylvalero nitrile) based on the total weight of the used monomers is added as an initiator into a flask with a cooler and an agitator and the monomers set forth in the following Table 1 are added thereto in the noted weight ratio. Then, 200 parts by weight of propylene glycol monomethyl etheracetate (PGMEA) based on 100 parts by weight of the total quantities of the initiator and the monomers are added as a solvent into the flask. The mixed solution is slowly agitated under a nitrogen atmosphere. A copolymer including aliphatic hydrocarbon is prepared by heating the resultant reactive solution up to 80° C. and then agitating it for 8 hours. The solid contents among the copolymer (A) solution prepared through the above-described method is 30 wt %, and a polystyrene-reduced weight average molecular weight measured by using gel permeation chromatography (GPC) ranged from 13,000 to 15,000.

TABLE 1

|  | Synthesis Example 1 | Synthesis Example 2 | Synthesis Example 3 | Synthesis Example 4 | Synthesis Example 5 | Synthesis Example 6 |
| --- | --- | --- | --- | --- | --- | --- |
| Maleic anhydride | 20 | 20 | 20 | — | — | — |
| Methacrylic acid | — | — | — | 17 | 17 | 17 |
| Tricyclodecanylo methacrylate | — | — | 15 | — | 40 | — |
| Styrene | — | 30 | 15 | — | — | 40 |
| Benzyl methacrylate | 80 | 50 | 50 | 83 | 43 | 43 |
| Weight average molecular weight (Mw) | 13,000 | 13,000 | 13,000 | 13,000 | 14,000 | 15,000 |

Synthesis Examples 7 to 9

Preparation of Copolymer Including the Structural Unit of Chemical Formula 1

100 wt % of copolymer synthesized according to Synthesis Examples 1 to 3 is added into a flask with a cooler and an agitator, and 7 wt % of cinnamyl alcohol (produced by Aldrich company) is added into the flask, and slowly agitated under a nitrogen atmosphere.

The copolymers including the structural units of the following Chemical Formulae 10 to 12, respectively, are prepared by heating the resultant reactive solution up to 50° C. and agitating it for 12 hours The weight average molecular weight, acid value, and content of the repeating unit represented by Chemical Formula 1 of the prepared copolymers are measured and the measurement results are set forth in the following Table 2.

[Chemical Formula 10]

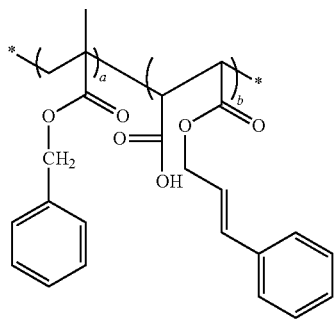

[Chemical Formula 11]

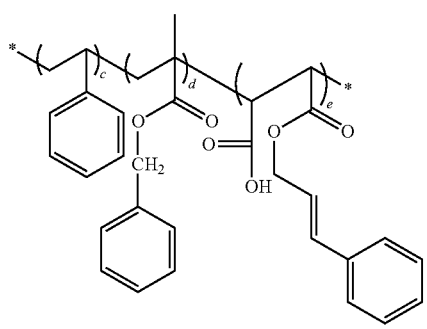

[Chemical Formula 12]

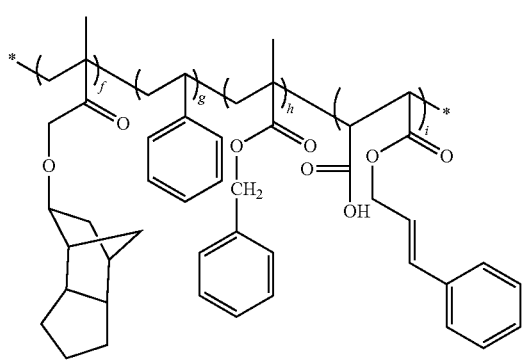

In Chemical Formulae 10 to 12, a to i are determined by amounts of the monomers.

Synthesis Examples 10 to 12

Preparation of Copolymer Including the Structural Unit of Chemical Formula 1

Copolymers including structural units represented by the following Chemical Formulae 13 to 15, respectively, are prepared according to the same method as Synthesis Examples 7 to 9, except that 11 wt % of pentaerythritol triacrylate (produced by Adrich company) is used instead of the cinnamyl alcohol. The weight average molecular weight, acid value and content of the repeating unit represented by Chemical Formula 1 of the prepared copolymers are measured and the measurement results are set forth in the following Table 2.

[Chemical Formula 13]

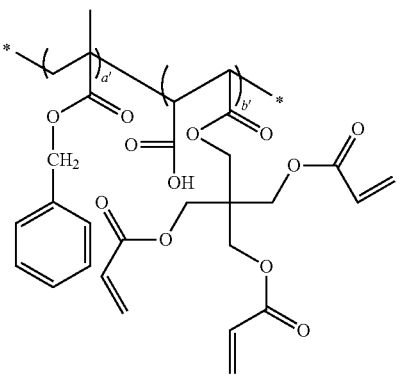

[Chemical Formula 14]

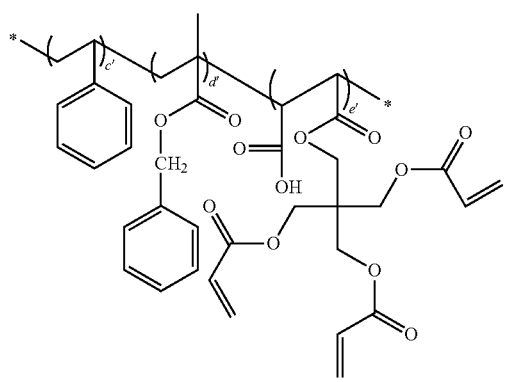

[Chemical Formula 15]

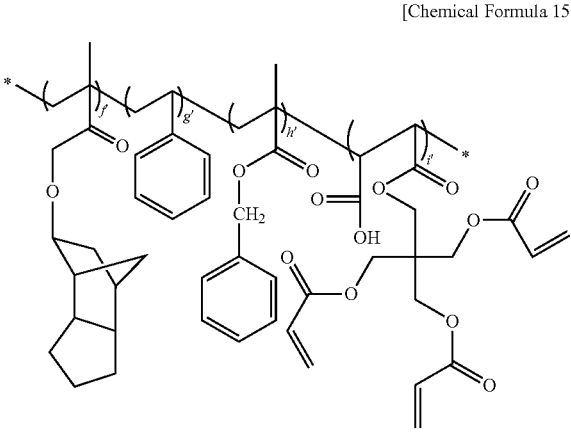

In Chemical Formulae 13 to 15, a' to i' are values decided based on the content of used monomer.

TABLE 2

|  | Weight average molecular weight (g/mol) | Acid value (mgKOH/g) | Content of structural unit of Chemical Formula 1 (wt %) |
| --- | --- | --- | --- |
| Synthesis Example 7 | 12,500 | 134 | 7 |
| Synthesis Example 8 | 13,200 | 132 | 7 |
| Synthesis Example 9 | 12,700 | 139 | 7 |
| Synthesis Example 10 | 14,300 | 121 | 11 |
| Synthesis Example 11 | 13,800 | 117 | 11 |
| Synthesis Example 12 | 14,700 | 118 | 11 |

Examples 1 to 6

Preparation of Photosensitive Resin Composition for a Color Filter

A photosensitive resin composition is prepared using the components described in the following Table 3. First, a photopolymerization initiator is dissolved in a solvent, and agitated at room temperature for two hours. Subsequently, the polymerized acrylic-based copolymer (A) and the acrylic-based photopolymerizable monomer obtained from Synthesis Examples 7 to 12 are added and agitated at a room temperature for two hours. A photosensitive resin composition for a color filter according to one embodiment of this disclosure is prepared by adding a pigment dispersed solution into the mixed solution, and agitating the mixed solution at a room temperature for one hour. The prepared composition is filtrated three times to removed impurities.

TABLE 3

| Composition | Content [g] |
|---|---|
| (A) Acrylic copolymer | 6.0 |
| (copolymer polymerized in Synthesis Examples 7 to 12) | |
| (B) Acrylic-based photopolymerizable monomer | |
| dipentaerythritol hexaacrylate (DPHA) | 4.1 |
| (C) photopolymerization initiator | |
| IGACURE OXE02 (Ciba Specialty Chemicals) | 0.2 |
| (D) Pigment dispersion | 46.8 |
| TDB-1 (DNS, blue pigment) | 9.2 |
| RL-01 (Clariant, purple pigment) | 0.8 |
| BYK 6919 (BYK, dispersing agent) | 2.4 |
| acryl copolymer of (A) | 5.4 |
| PGMEA (solvent) | 30.0 |
| (E) Solvent | ○ |
| PGMEA | 24.0 |
| ethylethoxy propionate | 11.4 |
| (F) Additive | |
| F-475 (DIC, fluorine-based surfactant) | 0.1 |

Comparative Examples 1 to 3

Preparation of Photosensitive Resin Composition for a Color Filter

A photosensitive resin composition for a color filter is prepared according to the same methods as Examples 1 to 6, except that the copolymers synthesized in Synthesis Examples 4 to 6 are used as an acrylic copolymer (A).

Experimental Examples

Evaluation of Resistance Against Stripping Liquid

The resistance against stripping liquid is evaluated with respect to each of the photosensitive resin compositions prepared according to Examples 1 to 6 and Comparative Examples 1 to 3.

The photosensitive resin compositions prepared according to Examples 1 to 6 and Comparative Examples 1 to 3 are applied onto a bare transparent circular glass substrate and onto a glass substrate coated with a 500 Å thick silicon nitride ($SiN_x$) layer using a spin-coater (produced by KDNS company, K-Spin8)

The coated substrate is soft-baked at 80° C. for 150 seconds with a hot-plate, exposed to a light using an exposer (produced by Nikon company, I10C) having an output (power) of 60 mJ, developed at a temperature of 25° C. for 60 seconds, rinsed for 60 seconds, and spin-dried for 25 seconds A 1 wt % of aqueous potassium hydroxide solution is used as a development liquid. Then, the developed product is hard baked in an oven at 230° C. for 30 minutes, and immersed in a stripping liquid at 70° C. (produced by J. T. Baker company, PRS-2000) for 10 minutes. Then, the product is rinsed with deionized water (DIW) and dried.

The color change of a film of the above-prepared photosensitive resin composition is measured using a color analyzer (which is a spectrophotometer, Otsuka Electronics Company, MCPD3000), and the stripping state is observed using an optical microscope. The results are set forth in the following Table 4.

<Color Change>
When the color change after the treatment with a stripping liquid is weak: excellent
When the color change after the treatment with a stripping liquid is intermediate: insufficient
When the color change after the treatment with a stripping liquid is strong: defective <Stripping State>
When the film of the photosensitive resin composition is not stripped off: excellent
When the film of the photosensitive resin composition is partially stripped off: insufficient
When most of the film of the photosensitive resin composition is stripped off: defective Heat Resistance The heat resistance of a stripping liquid is evaluated using the photosensitive resin compositions prepared according to Examples 1 to 6 and Comparative Examples 1 to 3.

The photosensitive resin compositions prepared according to Examples 1 to 9 and Comparative Examples 1 to 9 are coated to a thickness of 3 μm onto a bare transparent circular glass substrate and onto a glass substrate coated with 500 Å thick silicon nitride (SiNx) layer using a spin-coater (produced by KDNS company, K-Spin8).

The coated substrate is soft-baked with a hot-plate at 80° C. for 150 seconds, exposed using an exposer (produced by Nikon company, I10C) having an output (power) of 60 mJ, developed using a developer at a development temperature of 25° C. for 60 seconds, rinsed for 60 seconds, and spin-dried for 25 seconds. A 1 wt % of aqueous potassium hydroxide solution is used as a development liquid. Then the developed product is hard-baked in an oven at 230° C. for 30 minutes and the color is measured, and then baked in the oven at 230° C. again for 2 hours and the color change is measured using a spectrophotometer (produced by Otsuka Electronics, MCPD3000). The measurement results are set forth in the following Table 4.

<Heat Resistance>
When the color change after a heat treatment in an oven of 230° C. for 2 hours is weak: Excellent
When the color change after a heat treatment in an oven of 230° C. for 2 hours is intermediate: insufficient
When the color change after a heat treatment in an oven of 230° C. for 2 hours is strong: defective

TABLE 4

| | Color change | | Peeling off | | Heat resistance | |
|---|---|---|---|---|---|---|
| | Bare glass | $SiN_x$ | Bare glass | $SiN_x$ | Bare glass | $SiN_x$ |
| Example 1 | ◎ | ◎ | Δ | ◎ | ◎ | ◎ |
| Example 2 | ◎ | ◎ | Δ | ◎ | ◎ | ◎ |

TABLE 4-continued

| | Color change | | Peeling off | | Heat resistance | |
|---|---|---|---|---|---|---|
| | Bare glass | $SiN_x$ | Bare glass | $SiN_x$ | Bare glass | $SiN_x$ |
| Example 3 | ⊚ | ⊚ | ⊚ | ⊚ | ⊚ | ⊚ |
| Example 4 | ⊚ | ⊚ | ⊚ | ⊚ | ⊚ | ⊚ |
| Example 5 | ⊚ | ⊚ | ⊚ | ⊚ | ⊚ | ⊚ |
| Example 6 | ⊚ | ⊚ | ⊚ | ⊚ | ⊚ | ⊚ |
| Comparative Example 1 | Δ | Δ | X | Δ | Δ | Δ |
| Comparative Example 2 | X | X | X | Δ | X | X |
| Comparative Example 3 | X | X | Δ | Δ | Δ | Δ |

Note:
⊚ represents excellent, Δ represents insufficient, and X represents defective As shown in Table 4, the films formed of the photosensitive resin compositions prepared according to Examples 1 to 6 according to exemplary embodiments of the present invention exhibit little color change after the treatment with the stripping liquid, little stripping of the film, and excellent heat resistance. The results demonstrate that the photosensitive resin composition prepared according to the invention can have excellent resistance against a stripping liquid and heat.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter, comprising:

(A) a copolymer including a structural unit represented by Chemical Formula 1;
    (B) an acrylic-based photopolymerizable monomer;
    (C) a photopolymerization initiator;
    (D) a pigment; and
    (E) a solvent:

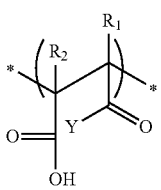

[Chemical Formula 1]

wherein, in Chemical Formula 1, $R_1$ and $R_2$ are the same or different and are each independently hydrogen or substituted or unsubstituted C1 to C20 alkyl, and Y is a structure represented by the following Chemical Formulae 2 to 4,

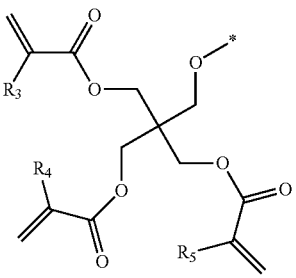

[Chemical Formula 2]

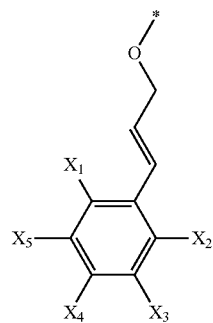

[Chemical Formula 3]

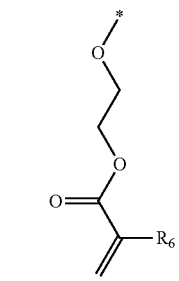

[Chemical Formula 4]

wherein, in Chemical Formulae 2 to 4, $R_3$ to $R_6$ are the same or different and are each independently hydrogen or substituted or unsubstituted C1 to C20 alkyl, and $X_1$ to $X_5$ are the same or different and are each independently hydrogen, halogen, hydroxyl, substituted or unsubstituted amino, substituted or unsubstituted C1 to C20 alkyl, allyl, or C6 to C30 aryl, wherein the copolymer (A) includes the structural unit represented by Chemical Formula 1 in an amount of about 0.05 to about 50 wt. % based on the total weight of the copolymer (A).

2. The photosensitive resin composition for a color filter of claim 1, wherein the photosensitive resin composition for a color filter comprises:

about 1 to about 60 wt. % of the copolymer (A) including a structural unit represented by Chemical Formula 1;
    about 0.5 to about 20 wt. % of the acrylic-based photopolymerizable monomer (B);
    about 0.1 to about 10 wt. % of the photopolymerization initiator (C);
    about 0.1 to about 40 wt. % of the pigment (D); and
    a balance amount of the solvent (E).

3. The photosensitive resin composition for a color filter of claim 1, wherein the copolymer (A) including a structural unit represented by Chemical Formula 1 has a weight average molecular weight (Mw) of about 3,000 to about 500,000 g/mol.

4. The photosensitive resin composition for a color filter of claim 1, wherein the copolymer (A) including a structural unit represented by Chemical Formula 1 has an acid value of about 20 to about 200 mgKOH/g.

5. The photosensitive resin composition for a color filter of claim 1, wherein the copolymer (A) including a structural unit represented by Chemical Formula 1 further comprises at least one structural unit represented by the following Chemical Formulae 5 to 9, or a combination thereof:

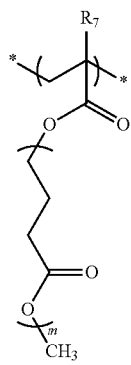

[Chemical Formula 5]

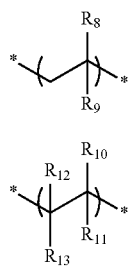

[Chemical Formula 6]

[Chemical Formula 7]

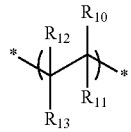

[Chemical Formula 8]

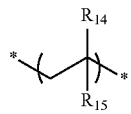

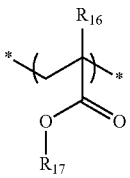

[Chemical Formula 9]

wherein, in Chemical Formula 5 to 9, $R_7$, $R_8$, $R_{10}$, $R_{12}$, $R_{14}$ and $R_{16}$ are the same or different and are independently hydrogen or C1 to C10 alkyl, $R_9$ is hydrogen, halogen, hydroxyl, carboxyl, substituted or unsubstituted C1 to C20 alkyl, or COR'COOH (wherein R' is substituted or unsubstituted C1 to C20 alkylene or substituted or unsubstituted C1 to C20 alkoxylene), $R_{11}$ is carboxyl or CONHR" wherein R" is substituted or unsubstituted C1 to C20 alkyl or substituted or unsubstituted C6 to C30 aryl, $R_{13}$ is carboxyl, or $R_{11}$ and $R_{13}$ are optionally fused with each other to form a ring, $R_{15}$ is substituted or unsubstituted C6 to C30 aryl, $R_{17}$ is substituted or unsubstituted C1 to C20 alkyl or substituted or unsubstituted C6 to C30 aryl, and m is an integer ranging from 1 to 5.

6. The photosensitive resin composition for a color filter of claim 5, wherein the structural units represented by Chemical Formulae 5 to 9 are present in a molar amount represented by n1, n2, n3, n4 and n5, respectively, wherein $5<n1<50$, $1<n2<20$, $5<n3<20$, $10<n4<100$, and $10<n5<100$.

7. The photosensitive resin composition for a color filter of claim 1, wherein the photosensitive resin composition further comprises an additive selected from a dispersing agent; malonic acid; 3-amino-1,2-propanediol; a silane-based coupling agent including a vinyl group or a (meth)acryloxy group; a leveling agent; a fluorine-based surfactant; a radical polymerization initiator, or a mixture thereof.

8. A color filter manufactured using the photosensitive resin composition for a color filter according to claim 1.

* * * * *